(12) United States Patent
Adachi et al.

(10) Patent No.: US 7,876,170 B2
(45) Date of Patent: Jan. 25, 2011

(54) FREQUENCY MODULATOR, FREQUENCY MODULATING METHOD, AND WIRELESS CIRCUIT

(75) Inventors: Hisashi Adachi, Mino (JP); Makoto Sakakura, Uji (JP)

(73) Assignee: Panasonic Corporation, Osaka (JP)

( * ) Notice: Subject to any disclaimer, the term of this patent is extended or adjusted under 35 U.S.C. 154(b) by 946 days.

(21) Appl. No.: 11/790,017

(22) Filed: Apr. 23, 2007

(65) Prior Publication Data

US 2007/0200645 A1 Aug. 30, 2007

Related U.S. Application Data

(62) Division of application No. 11/122,115, filed on May 5, 2005, now Pat. No. 7,224,238, which is a division of application No. 10/384,556, filed on Mar. 11, 2003, now Pat. No. 7,075,383.

(30) Foreign Application Priority Data

Mar. 12, 2002 (JP) ............................. 2002-066884

(51) Int. Cl.
*H03C 3/06* (2006.01)
(52) U.S. Cl. .................... 332/127; 332/128; 331/34; 327/159
(58) Field of Classification Search .............. 332/127, 332/128; 331/1 A, 17, 34; 327/156, 159
See application file for complete search history.

(56) References Cited

U.S. PATENT DOCUMENTS 4,755,774 A * 7/1988 Heck ........................ 332/123
5,903,194 A * 5/1999 Opsahl et al. ............... 331/1 A
5,952,895 A * 9/1999 McCune et al. ............. 332/128
5,986,512 A * 11/1999 Eriksson ..................... 331/16
6,717,998 B2   4/2004 Adachi et al.
6,756,927 B2 * 6/2004 Hammes et al. ............. 341/143

FOREIGN PATENT DOCUMENTS

EP            1 111 793        12/2000

* cited by examiner

*Primary Examiner*—Michael B Shingleton
(74) *Attorney, Agent, or Firm*—Wenderoth, Lind & Ponack, L.L.P.

(57) ABSTRACT

A voltage controlled oscillator 1, a variable frequency divider 2, a phase comparator 3, and a loop filter 4 form a Phase Locked Loop (PLL). A sigma-delta modulator 5 sigma-delta modulates data obtained by adding a fractional part M2 of the frequency division factor data with modulation data X by using an output signal of the variable frequency divider 2 as a clock. An output signal of the sigma-delta modulator 5 is added to an integral part M1 of the frequency division factor data, and the resultant data becomes effective frequency division factor data 13 of the variable frequency divider 2. An output signal of the sigma-delta modulator 5 also becomes control data 14 after passing through a D/A converter 6, a low-pass filter 7, and an amplitude adjustment circuit 8. The control data 14 is inputted into a frequency modulation terminal of the voltage controlled oscillator 1. Therefore, it is possible to provide a frequency modulator that can use a reference signal source having no frequency modulation function, and perform modulation over a wide range of frequencies based on a digital modulation signal.

10 Claims, 13 Drawing Sheets

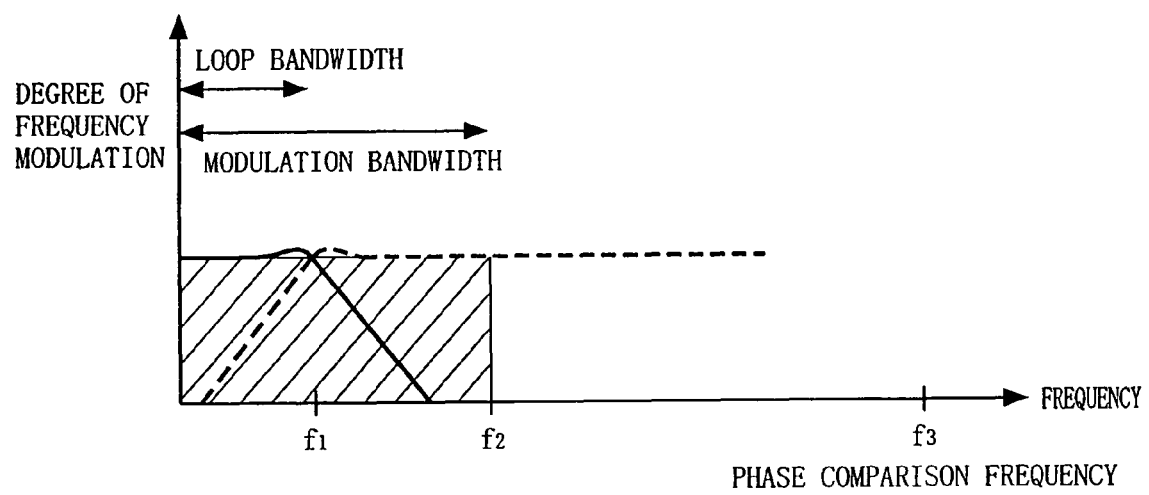
F I G. 1 4  PRIOR ART

FREQUENCY MODULATOR, FREQUENCY MODULATING METHOD, AND WIRELESS CIRCUIT

This application is a divisional of application Ser. No. 11/122,115, filed May 5, 2005, now U.S. Pat. No. 7,224,238 which is a divisional of application Ser. No. 10/384,556, filed Mar. 11, 2003, now U.S. Pat. No. 7,075,383.

BACKGROUND OF THE INVENTION

1. Field of the Invention

The present invention relates to frequency modulators, more particularly, a frequency modulator and a frequency modulating method for performing frequency modulation using a PLL (Phase Locked Loop), and a wireless circuit using the frequency modulator and the frequency modulating method.

2. Description of the Background Art

As exemplary methods for performing frequency modulation using a PLL, the following two methods are known. In a first method, a reference signal source is subjected to frequency modulation. In a second method, a modulation signal is supplied to a frequency control terminal of a voltage controlled oscillator. In general, the modulation signal used in digital communications, etc., has flat frequency characteristics from low to high frequencies within a predetermined band. Thus, in the case where frequency modulation is performed based on such a modulation signal, flat characteristics have to be obtained when the modulation signal spans over a range of low to high frequencies.

The above-described first method, however, requires a reference signal source having a frequency modulation function, and makes it difficult to modulate over a frequency band wider than a PLL loop bandwidth. In this case, a widened PLL loop bandwidth enables modulation over a wide range of frequencies. However, the widened loop bandwidth generally deteriorates a C/N (Carrier to Noise Ratio) obtained at a point away from zero by a width corresponding to the loop bandwidth. Thus, a PLL does not allow its loop bandwidth to be sufficiently widened.

On the other hand, the above-described second method makes it difficult to modulate over a frequency lower than the PLL loop bandwidth. In this case, a narrowed PLL loop bandwidth enables modulation over a lower frequency band. However, the narrowed loop bandwidth generally slows the loop response speed of the PLL. Thus, a PLL does not also allow its loop bandwidth to be sufficiently narrowed.

In order to solve the above-described problems, a third method that is a combined adoption of the above-described first and second methods is known. FIG. 13 is a block diagram illustrating the structure of a conventional frequency modulator using the third method. The frequency modulator shown in FIG. 13 includes a voltage controlled oscillator 1, a variable frequency divider 2, a phase comparator 3, a loop filter 4, and a reference signal source 10. The reference signal source 10 generates a reference signal with a predetermined frequency. The voltage controlled oscillator 1, the variable frequency divider 2, the phase comparator 3, and the loop filter 4 form the PLL, which will be described below.

The variable frequency divider 2 divides the frequency of an output signal of the voltage controlled oscillator 1 based on provided frequency division factor data M. The phase comparator 3 compares the phases of an output signal of the reference signal source 10 and the output signal of the variable frequency divider 2. The output signal of the phase comparator 3 is inputted into the voltage controlled oscillator 1 after passing through the loop filter 4. The voltage controlled oscillator 1 oscillates at a frequency appropriate to the output signal of the loop filter 4. This PLL performs feedback control so as to keep a center frequency of the output signal of the voltage controlled oscillator 1 at a predetermined value. The reference signal source 10 and the voltage controlled oscillator 1 are each provided with a frequency modulation terminal, to which an analog modulation signal Xa is supplied.

FIG. 14 is an illustration showing frequency modulation characteristics of the frequency modulator shown in FIG. 13. In FIG. 14, low-pass characteristics shown in solid line represent the degree of modulation of the output signal against a modulation signal supplied to the reference signal source 10, and high-pass characteristics shown in dashed line represent the degree of modulation of the output signal against a modulation signal supplied to the voltage controlled oscillator 1. In this case, it is possible to obtain frequency modulation characteristics that are flat over a wide range of frequencies by adding the low-pass characteristics (solid line) and the high-pass characteristics (dashed line). Thus, even if a bandwidth (shaded portion) of a modulation signal is wider than a PLL loop bandwidth, it is possible to obtain good frequency modulation characteristics.

However, the frequency modulator using the above-described third method has to be supplied with an analog modulation signal, which results in the need of a high-precision D/A converter that converts digital modulation data into the analog modulation signal. Furthermore, the modulation signal is supplied to both the reference signal source and the voltage controlled oscillator, which results in the need of individual adjustment of the level of the modulation signal in both the reference signal source and the voltage controlled oscillator in order to obtain good frequency modulation characteristics.

SUMMARY OF THE INVENTION

Therefore, an object of the present invention is to provide a frequency modulator that can use a reference signal source having no frequency modulation function, and perform modulation over a wide range of frequencies based on a digital modulation signal.

The present invention has the following features to attain the object mentioned above.

A first aspect of the present invention is directed to a frequency modulator that performs frequency modulation based on digital modulation data, including: a sigma-delta modulator for sigma-delta modulating data obtained by adding a fractional part of provided frequency division factor data with modulation data; a voltage controlled oscillator that can control an oscillation frequency; a variable frequency divider for dividing a frequency of an output of the voltage controlled oscillator based on data obtained by adding an output of the sigma-delta modulator with an integral part of the frequency division factor data; a phase comparator for comparing phases of a provided reference signal and an output of the variable frequency divider; and a loop filter for smoothing an output of the phase comparator and providing the smoothed signal to the voltage controlled oscillator, wherein the output of the voltage controlled oscillator is frequency-modulated based on a control signal that is an analog signal converted from the output of the sigma-delta modulator.

Thus, according to the first aspect, frequency modulation by the variable frequency divider and frequency modulation by the voltage controlled oscillator are concurrently performed based on the digital modulation data. The degree of modulation of the output signal corresponds to the sum of the modulation characteristics of the above-described two types of frequency modulation, thereby frequency modulation characteristics that are flat over a bandwidth wider than a loop bandwidth are obtained. Thus, it is possible to use a reference signal source having no frequency modulation function, and perform frequency modulation over a wide range of frequencies based on a digital modulation signal.

In this case, the voltage controlled oscillator may include a frequency control terminal connected to the loop filter and a frequency modulation terminal for inputting the control signal, and the voltage controlled oscillator may control the oscillation frequency based on an output of the loop filter and the control signal inputted from the frequency modulation terminal. As a result, it is possible to perform frequency modulation over a wide range of frequencies based on the digital modulation data by using the voltage controlled oscillator having the frequency modulation terminal. Furthermore, the voltage controlled oscillator whose change of output frequency in response to a change in input frequency at the frequency modulation terminal may be smaller compared to its change of output frequency in response to a change in input frequency at the frequency control terminal, thereby enabling to increase the modulation accuracy.

Alternatively, the control signal may be connected to a junction point between the loop filter and the voltage controlled oscillator. Thus, it is possible to perform frequency modulation over a wide range of frequencies based on the digital modulation data by using the voltage controlled oscillator having no frequency modulation terminal. Alternatively, a frequency bandwidth of the modulation data may be wider than a bandwidth of the loop filter, and a highest frequency of the modulation data may be smaller than a frequency of the reference signal.

Alternatively, the frequency modulator may further include, on a route from the sigma-delta modulator to the voltage controlled oscillator, an amplitude adjustment circuit for adjusting signal amplitude. Thus, it is possible to obtain a correct output signal by adjusting the amplitude of the control signal in accordance with characteristics of the voltage controlled oscillator. Alternatively, the frequency modulator may further include, on a route from the sigma-delta modulator to the voltage controlled oscillator, a low-pass filter for removing a noise component caused in the sigma-delta modulator. Thus, it is possible to obtain an output signal with low-noise components by removing the noise component caused in the sigma-delta modulator.

Alternatively, the sigma-delta modulator may operate by using either an output of the variable frequency divider or the reference signal as a clock, and may be of at least a second order or higher. Thus, it is possible to perform sigma-delta modulation without the need to generate an additional high-speed clock signal, and also obtain a stable output signal by performing highly stable sigma-delta modulation.

A second aspect of the present invention is directed to a frequency modulator that performs frequency modulation based on digital modulation data, including: a sigma-delta modulator for sigma-delta modulating data obtained by adding a fractional part of provided frequency division factor data with modulation data; a voltage controlled oscillator that can control an oscillation frequency; a variable frequency divider for dividing a frequency of an output of the voltage controlled oscillator based on data obtained by adding an output of the sigma-delta modulator with an integral part of the frequency division factor data; a phase comparator for comparing phases of a provided reference signal and an output of the variable frequency divider; and a loop filter for smoothing an output of the phase comparator and providing the smoothed signal to the voltage controlled oscillator, wherein the output of the voltage controlled oscillator is frequency-modulated based on a control signal that is an analog signal converted from data obtained by adding the output of the sigma-delta modulator with the integral part of the frequency division factor data. According to the above-described second aspect, the same effect can be produced as in the case of the first aspect.

A third aspect of the present invention is directed to a frequency modulator that performs frequency modulation based on digital modulation data, including: a sigma-delta modulator for sigma-delta modulating data obtained by adding a fractional part of provided reference frequency division factor data with modulation data; a reference frequency divider for dividing a frequency of a provided reference signal based on data obtained by adding an output of the sigma-delta modulator with an integral part of the reference frequency division factor data; a voltage controlled oscillator that can control an oscillation frequency; a frequency divider for dividing a frequency of an output of the voltage controlled oscillator; a phase comparator for comparing phases of the reference signal frequency-divided by the reference frequency divider and an output of the frequency divider; and a loop filter for smoothing an output of the phase comparator and providing the smoothed signal to the voltage controlled oscillator, wherein the output of the voltage controlled oscillator is frequency-modulated based on a control signal that is an analog signal converted from the output of the sigma-delta modulator.

Thus, according to the third aspect, frequency modulation by the reference signal source and frequency modulation by the voltage controlled oscillator are concurrently performed based on the digital modulation data. The degree of modulation of the output signal corresponds to the sum of the modulation characteristics of the above-described two types of frequency modulation, thereby frequency modulation characteristics that are flat over a bandwidth wider than a loop bandwidth are obtained. Thus, it is possible to use a reference signal source having no frequency modulation function, and perform frequency modulation over a wide range of frequencies based on a digital modulation signal.

In this case, the frequency divider may be a variable frequency divider, thereby being able to handle varying frequencies. Alternatively, the voltage controlled oscillator may include a frequency control terminal connected to the loop filter and a frequency modulation terminal for inputting the control signal, and the voltage controlled oscillator may control the oscillation frequency based on an output of the loop filter and the control signal inputted from the frequency modulation terminal. Thus, it is possible to perform frequency modulation over a wide range of frequencies based on the digital modulation data by using the voltage controlled oscillator having the frequency modulation terminal. Furthermore, the voltage controlled oscillator whose change of output frequency in response to a change in input frequency at the frequency modulation terminal may be smaller compared to its change of output frequency in response to a change in input frequency at the frequency control terminal, thereby enabling to increase the modulation accuracy.

Alternatively, the control signal may be connected to a junction point between the loop filter and the voltage controlled oscillator. Thus, it is possible to perform frequency modulation over a wide range of frequencies based on the digital modulation data by using the voltage controlled oscillator having no frequency modulation terminal. Alternatively, a frequency bandwidth of the modulation data may be wider than a bandwidth of the loop filter, and a highest frequency of the modulation data may be smaller than a frequency of the reference signal.

Alternatively, the frequency modulator may further include, on a route from the sigma-delta modulator to the voltage controlled oscillator, an amplitude adjustment circuit for adjusting signal amplitude. Thus, it is possible to obtain a correct output signal by adjusting the amplitude of the control signal in accordance with characteristics of the voltage controlled oscillator. Alternatively, the frequency modulator may further include, on a route from the sigma-delta modulator to the voltage controlled oscillator, a low-pass filter for removing a noise component caused in the sigma-delta modulator. Thus, it is possible to obtain an output signal with low-noise components by removing the noise component caused in the sigma-delta modulator.

Alternatively, the sigma-delta modulator may operate by using the reference signal as a clock, and may be of at least a second order or higher. Thus, it is possible to perform sigma-delta modulation without the need to generate an additional high-speed clock signal, and also obtain a stable output signal by performing highly stable sigma-delta modulation.

A fourth aspect of the present invention is directed to a frequency modulator that performs frequency modulation based on digital modulation data, including: a sigma-delta modulator for sigma-delta modulating data obtained by adding a fractional part of provided reference frequency division factor data with modulation data; a reference frequency divider for dividing a frequency of a provided reference signal based on data obtained by adding an output of the sigma-delta modulator with an integral part of the reference frequency division factor data; a voltage controlled oscillator that can control an oscillation frequency; a frequency divider for dividing a frequency of an output of the voltage controlled oscillator; a phase comparator for comparing phases of the reference signal frequency-divided by the reference frequency divider and an output of the frequency divider; and a loop filter for smoothing an output of the phase comparator and providing the smoothed signal to the voltage controlled oscillator, wherein the output of the voltage controlled oscillator is frequency-modulated based on a control signal that is an analog signal converted from data obtained by adding the output of the sigma-delta modulator with the integral part of the reference frequency division factor data. According to the above-described fourth aspect, the same effect can be produced as in the case of the third aspect.

A fifth aspect of the present invention is directed to a frequency modulating method for performing frequency modulation based on digital modulation data by using a phase locked loop having a voltage controlled oscillator, a variable frequency divider, a phase comparator, and a loop filter, including: a step of sigma-delta modulating data obtained by adding a fractional part of provided frequency division factor data with modulation data; a step of providing data obtained by adding the sigma-delta modulated signal with an integral part of the frequency division factor data to the variable frequency divider as effective frequency division factor data; and a step of frequency modulating an output of the voltage controlled oscillator based on a control signal that is an analog signal converted from the sigma-delta modulated signal.

A sixth aspect of the present invention is directed to a frequency modulating method for performing frequency modulation based on digital modulation data by using a phase locked loop having a voltage controlled oscillator, a frequency divider, a phase comparator, and a loop filter, including: a step of sigma-delta modulating data obtained by adding a fractional part of provided reference frequency division factor data with modulation data; a step of dividing a frequency of a provided reference signal based on data obtained by adding the sigma-delta modulated signal with an integral part of the reference frequency division factor data and providing the frequency-divided signal to the phase locked loop; and a step of frequency modulating an output of the voltage controlled oscillator based on a control signal that is an analog signal converted from the sigma-delta modulated signal.

Thus, according to either the above-described fifth or sixth aspect, frequency modulation by the variable frequency divider (or a reference signal source) and frequency modulation by the voltage controlled oscillator are concurrently performed based on the digital modulation data. The degree of modulation of the output signal corresponds to the sum of the modulation characteristics of the above-described two types of frequency modulation, thereby frequency modulation characteristics that are flat over a bandwidth wider than a loop bandwidth are obtained. Thus, it is possible to use a reference signal source having no frequency modulation function, and perform frequency modulation over a wide range of frequencies based on a digital modulation signal.

A seventh aspect of the present invention is directed to a wireless circuit that transmits and receives a signal frequency-modulated based on digital modulation data, including: a reference oscillator for generating a reference signal; a frequency modulator that operates based on the reference signal; an antenna for transmitting and receiving an electric wave; a transmission amplifier for amplifying an output of the frequency modulator and outputting the amplified signal to the antenna; and a receiving circuit for processing a signal received by the antenna, wherein the frequency modulator includes: a sigma-delta modulator for sigma-delta modulating data obtained by adding a fractional part of provided frequency division factor data with modulation data; a voltage controlled oscillator that can control an oscillation frequency; a variable frequency divider for dividing a frequency of an output of the voltage controlled oscillator based on data obtained by adding an output of the sigma-delta modulator with an integral part of the frequency division factor data; a phase comparator for comparing phases of the reference signal and an output of the variable frequency divider; and a loop filter for smoothing an output of the phase comparator and providing the smoothed signal to the voltage controlled oscillator, wherein the output of the voltage controlled oscillator is frequency-modulated based on a control signal that is an analog signal converted from the output of the sigma-delta modulator, wherein when data is transmitted, the frequency modulator is controlled so as to perform frequency modulation based on data to be transmitted, and when data is received, the frequency modulator is controlled so as to output a non-modulated signal, and wherein the receiving circuit processes the signal received by the antenna by using the non-modulated signal outputted from the frequency modulator as a local signal.

An eighth aspect of the present invention is directed to a wireless circuit that transmits and receives a signal frequency-modulated based on digital modulation data, including: a reference oscillator for generating a reference signal; a frequency modulator that operates based on the reference signal; an antenna for transmitting and receiving an electric wave; a transmission amplifier for amplifying an output of the frequency modulator and outputting the amplified signal to the antenna; and a receiving circuit for processing a signal received by the antenna, wherein the frequency modulator includes: a sigma-delta modulator for sigma-delta modulating data obtained by adding a fractional part of provided reference frequency division factor data with modulation data; a reference frequency divider for dividing a frequency of the reference signal based on data obtained by adding an output of the sigma-delta modulator with an integral part of the reference frequency division factor data; a voltage controlled oscillator that can control an oscillation frequency; a frequency divider for dividing a frequency of an output of the voltage controlled oscillator; a phase comparator for comparing phases of the reference signal frequency-divided by the reference frequency divider and an output of the frequency divider; and a loop filter for smoothing an output of the phase comparator and providing the smoothed signal to the voltage controlled oscillator, and wherein the output of the voltage controlled oscillator is frequency-modulated based on a control signal that is an analog signal converted from the output of the sigma-delta modulator, wherein when data is transmitted, the frequency modulator is controlled so as to perform frequency modulation based on data to be transmitted, and when data is received, the frequency modulator is controlled so as to output a non-modulated signal, and wherein the receiving circuit processes the signal received by the antenna by using the non-modulated signal outputted from the frequency modulator as a local signal.

Thus, according to either the above-described seventh or eighth aspect, even if no analog modulation signal is provided, it is possible to realize a wireless circuit by providing digital data for designating a frequency channel and digital modulation data for performing frequency modulation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is an illustration showing frequency modulation characteristics of the frequency modulator.

DESCRIPTION OF THE PREFERRED EMBODIMENTS

First Embodiment

Figure 1:
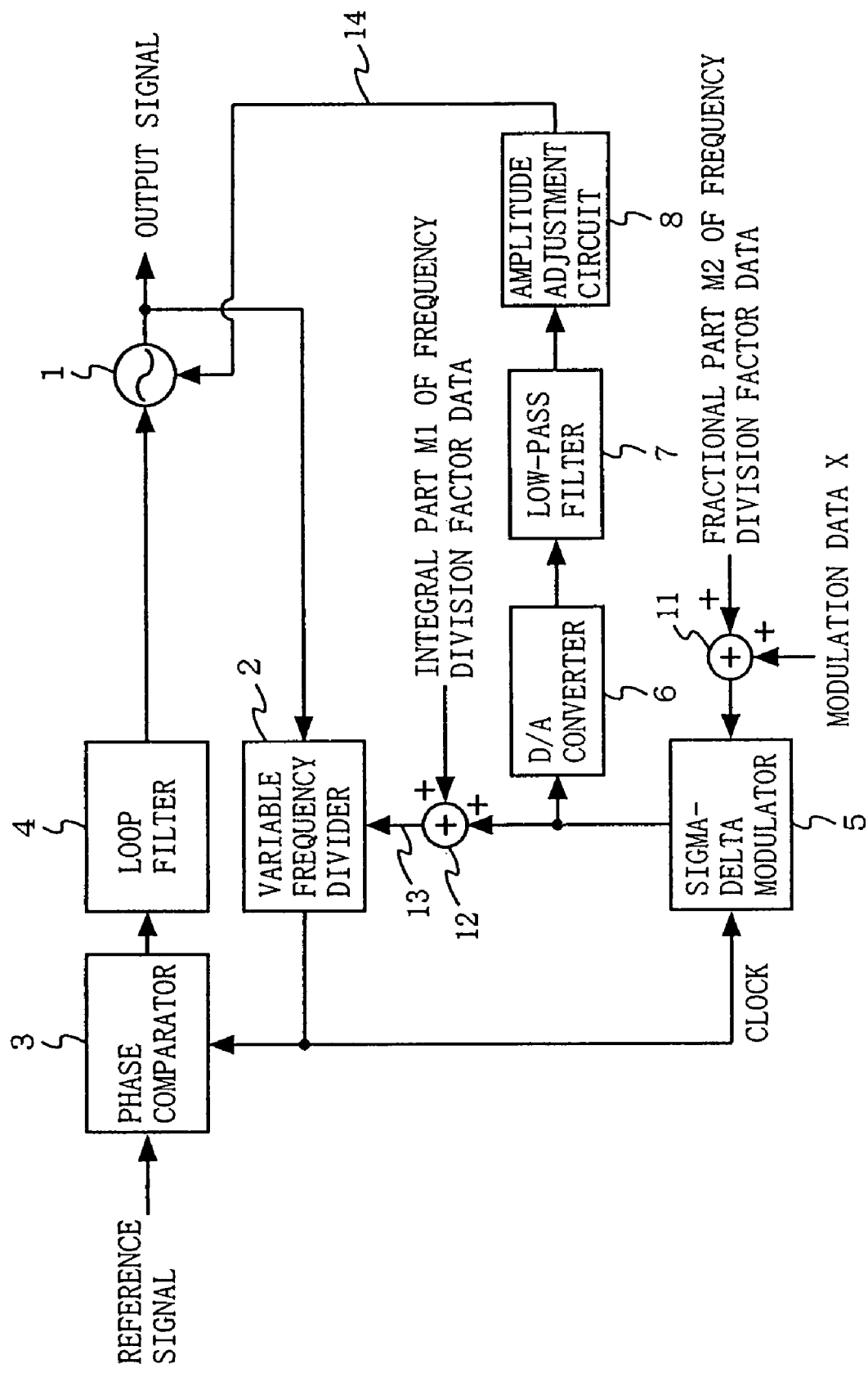
FIG. 1 is a block diagram illustrating the structure of a frequency modulator according to a first embodiment of the present invention.

FIG. 1 is a block diagram illustrating the structure of a frequency modulator according to a first embodiment of the present invention. The frequency modulator shown in FIG. 1 includes a voltage controlled oscillator 1, a variable frequency divider 2, a phase comparator 3, a loop filter 4, a sigma-delta modulator 5, a D/A converter 6, a low-pass filter 7, an amplitude adjustment circuit 8, and adders 11 and 12. A reference signal with a predetermined frequency is provided to the frequency modulator from an external source (not shown), which can be a signal source having no frequency modulation function.

The voltage controlled oscillator 1, the variable frequency divider 2, the phase comparator 3, and the loop filter 4 form a phase locked loop (PLL) described below. The variable frequency divider 2 divides a frequency of an output signal of the voltage controlled oscillator 1 based on provided effective frequency division factor data 13. The phase comparator 3 compares the phases of the output signal of the variable frequency divider 2 and the reference signal. The output signal of the phase comparator 3 is inputted into a frequency control terminal of the voltage controlled oscillator 1 after passing through the loop filter 4. The voltage controlled oscillator 1 oscillates at a frequency appropriate to the output signal of the loop filter 4. This PLL performs feedback control so as to keep a center frequency of the output signal of the voltage controlled oscillator 1 at a predetermined value.

The effective frequency division factor data 13 provided to the variable frequency divider 2 is calculated as follows. Frequency division factor data is externally provided to the variable frequency divider 2 as a set of an integral part M1 of the frequency division factor data and a fractional part M2 of the frequency division factor data. The adder 11 adds the fractional part M2 with digital modulation data X. The sigma-delta modulator 5 sigma-delta modulates the output data of the adder 11 by using the output signal of the variable frequency divider 2 as a clock. The output signal of the sigma-delta modulator 5 is inputted into the adder 12 and the D/A converter 6. The adder 12 adds the output signal of the sigma-delta modulator 5 with the integral part M1. The output data of the adder 12 becomes the effective frequency division factor data 13.

On the other hand, the D/A converter 6 converts the output signal of the sigma-delta modulator 5 into an analog signal. The analog signal becomes a control signal 14 after passing through the low-pass filter 7 and the amplitude adjustment circuit 8. As the low-pass filter 7, a filter having a passband wider than the bandwidth of the modulation signal is used. The low-pass filter 7 removes a higher frequency noise component caused in the sigma-delta modulator 5 from the analog signal outputted from the D/A converter 6. The amplitude adjustment circuit 8 adjusts the magnitude of the output signal of the low-pass filter 7 so as to be a value appropriate to the modulation sensitivity of the frequency modulation terminal of the voltage controlled oscillator 1. The control signal 14 is inputted into the frequency modulation terminal of the voltage controlled oscillator 1.

The frequency modulator structured as above performs two types of frequency modulation at the same time. In a first frequency modulation, the modulation data X is sigma-delta modulated. The sigma-delta modulated data is then provided to the variable frequency divider 2 as the effective frequency division factor data 13. Thus, the output signal of the PLL is frequency-modulated. The first frequency modulation produces an effect similar to the low-pass characteristics shown in FIG. 14 in solid line. In a second frequency modulation, the modulation data X becomes a signal changing in a stepwise manner due to the actions of the sigma-delta modulator 5 and the D/A converter 6. The signal becomes the control signal 14 after passing through the low-pass filter 7 and the amplitude adjustment circuit 8. The control signal 14 is inputted into the frequency modulation terminal of the voltage controlled oscillator 1. Thus, the output signal of the voltage controlled oscillator 1 is frequency-modulated. The second frequency modulation produces an effect similar to the high-pass characteristics shown in FIG. 14 in dashed line.

Therefore, the degree of modulation of the output signal of the frequency modulator corresponds to the sum of the low-pass characteristics (solid line) and the high-pass characteristics (dashed line) shown in FIG. 14. Thus, the frequency modulator according to the present embodiment enables the use of a reference signal source having no frequency modulation function, and also allows flat frequency modulation characteristics to be obtained for a modulation signal having a bandwidth wider than a loop bandwidth based on digital modulation data. Especially, as shown in FIG. 14, even if the frequency bandwidth of the modulation data is wider than the bandwidth of the loop filter, and the highest frequency of the modulation data is smaller than the frequency of the reference signal, the same effect can be produced.

The second frequency modulation described above is performed for the following reason. The frequency modulator according to the present embodiment is provided with high-precision digital modulation data X as a modulation signal. The modulation data X is treated as a variant of the fractional part M2 of the frequency division factor data. That is, the modulation data X is added to the fractional part M2, and sigma-delta modulated by the sigma-delta modulator 5. Based on the inputted data, the sigma-delta modulator 5 outputs data provided with a smaller number of bits but with a higher clock frequency than the inputted data. As a result, if the clock of the sigma-delta modulator 5 is set sufficiently high compared with frequency components of the modulation signal, the sigma-delta modulated data includes almost all information included in the modulation signal.

Quantization noise caused by sigma-delta modulation is added to the sigma-delta modulated data. Thus, the quantization noise is also introduced in the output signal of the variable frequency divider 2. The quantization noise is sufficiently reduced at the loop filter 4 that has low-pass characteristics, thereby being prevented from being introduced into the output signal of the voltage controlled oscillator 1. However, among frequency components of the modulation signal, frequency components higher than the loop bandwidth (determined mainly by the characteristics of the loop filter 4) of the PLL are attenuated at the same time when the signal passes through the loop filter 4. In order to compensate for the above-described attenuated frequency components, the frequency modulator according to the present embodiment provides the control signal 14, which is an analog signal converted from the sigma-delta modulated data, to the frequency modulation terminal of the voltage controlled oscillator 1. This is the reason why the second frequency modulation is performed.

The frequency modulator used in digital communications, etc., is provided with high-precision digital modulation data X. Therefore, it is necessary to use a high-precision D/A converter to directly D/A convert the modulation data X. On the other hand, the output of the sigma-delta modulator 5 according to the present embodiment is a signal with a high-speed clock signal but with a smaller number of bits, thereby allowing the use of the simple and moderate-precision D/A converter 6. Even with such a D/A converter 6, it is possible to reproduce a high-precision analog frequency modulation signal, and provide the reproduced signal to the frequency modulation terminal of the voltage controlled oscillator 1 by removing a higher frequency noise component caused by sigma-delta modulation by the low-pass filter 7.

Hereinafter, the sigma-delta modulator 5 in the frequency modulator of the present embodiment is described. FIGS. 2 to 5 are all exemplary illustrations of the structure of the sigma-delta modulator 5 using a Z transform, wherein one clock delay is denoted as $Z^{-1}$.

Figure 2:
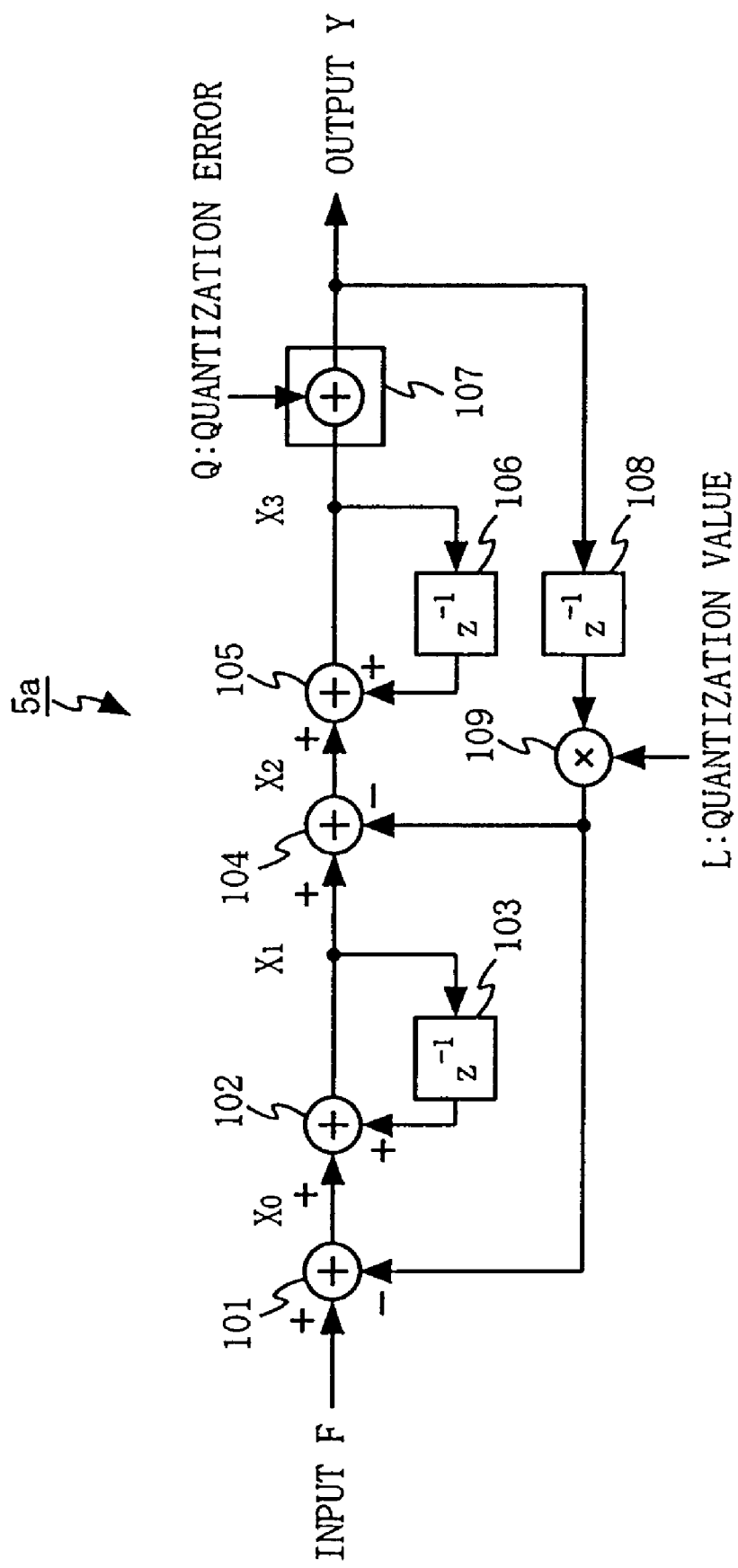
FIG. 2 is an exemplary illustration of the structure of a sigma-delta modulator in the frequency modulator according to the first embodiment and a second embodiment of the present invention.

FIG. 2 is an exemplary illustration of the structure of a second-order sigma-delta modulator. The sigma-delta modulator 5a shown in FIG. 2 includes adders 101, 102, 104, and 105, delay circuits 103, 106, and 108, a quantizer 107, and a multiplier 109. The quantizer 107 quantizes an output of the adder 105 by a quantization value L. The output of the quantizer 107 is inputted into the multiplier 109 after passing through the delay circuit 108. The multiplier 109 multiplies the input by the quantization value L. The output of the multiplier 109 is inputted into the adders 101 and 104. The adder 101 subtracts the output of the multiplier 109 from an input F of the sigma-delta modulator 5a. The output of the adder 101 is inputted into the adder 104 after passing through a first-order integrator structured by the adder 102 and the delay circuit 103. From this input, the adder 104 subtracts the output of the multiplier 109. The output of the adder 104 is inputted into the quantizer 107 after passing through a first-order integrator structured by the adder 105 and the delay circuit 106.

In the sigma-delta modulator 5a, a relationship between the input F and an output Y is represented as $Y=F/L+(1-Z^{-1})^2 \times Q$. Thus, if a clock frequency is denoted by $f_s$, frequency characteristics for $|1-Z^{-1}|$ are given as $|2 \sin(\pi f/f_s)|$. As a result, frequency characteristic $|2 \sin(\pi f/f_s)|^2$ is multiplied with the quantization noise Q in the sigma-delta modulator 5a.

Figure 3:
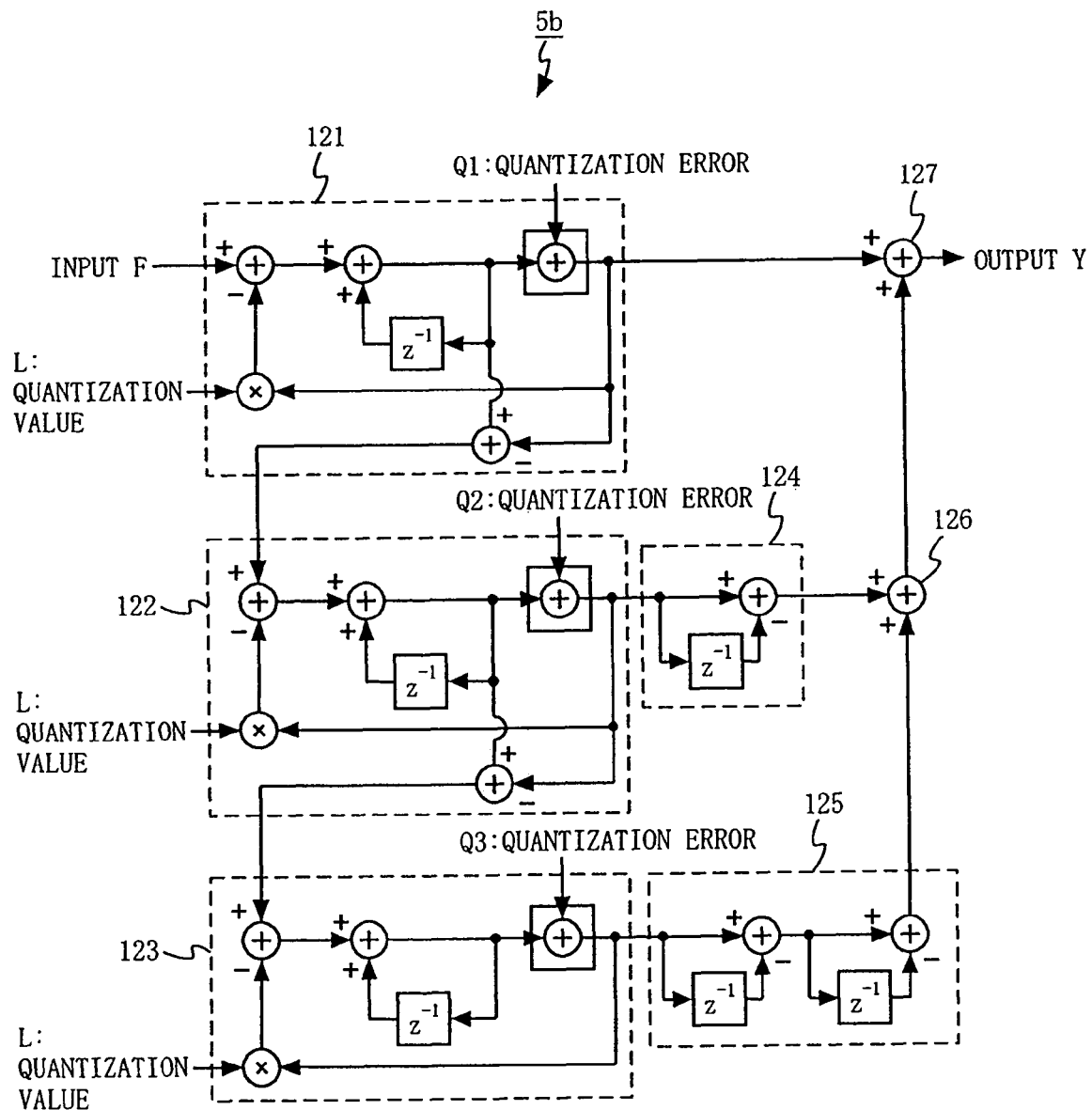
FIG. 3 is an exemplary illustration of another structure of the sigma-delta modulator in the frequency modulator according to the first and second embodiments.

FIG. 3 is an exemplary illustration of the structure of a third-order sigma-delta modulator. The sigma-delta modulator 5b shown in FIG. 3 includes first-order sigma-delta modulators 121, 122, and 123, a first-order differentiator 124, a second-order differentiator 125, and adders 126 and 127. The sigma-delta modulator 5b has a multistage structure with a plurality of the first-order sigma-delta modulators connected to each other. That is, a value corresponding to a fractional part of the first-order sigma-delta modulator 121 is inputted into the first-order sigma-delta modulator 122, and a value corresponding to a fractional part of the first-order sigma-delta modulator 122 is inputted into the first-order sigma-delta modulator 123. Furthermore, a value corresponding to an integral part of the first-order sigma-delta modulator 122 is inputted into the first-order differentiator 124, and a value corresponding to an integral part of the first-order sigma-delta modulator 123 is inputted into the second-order differentiator 125. The adders 126 and 127 add the value corresponding to the integral part of the first-order sigma-delta modulator 121, the output of the first-order differentiator 124, and the output of the second-order differentiator 125. As a result, an output Y of the sigma-delta modulator 5b is calculated.

In the sigma-delta modulator 5b, a relationship between an input F and the output Y is represented as $Y=F/L+(1-Z^{-1})^3 \times Q$. Therefore, according to the same consideration as in the case of the sigma-delta modulator 5a, frequency characteristic $|2 \sin(\pi f/f_s)|^3$ ($f_s$: clock frequency) is multiplied with the quantization noise Q in the sigma-delta modulator 5b.

Figure 4:
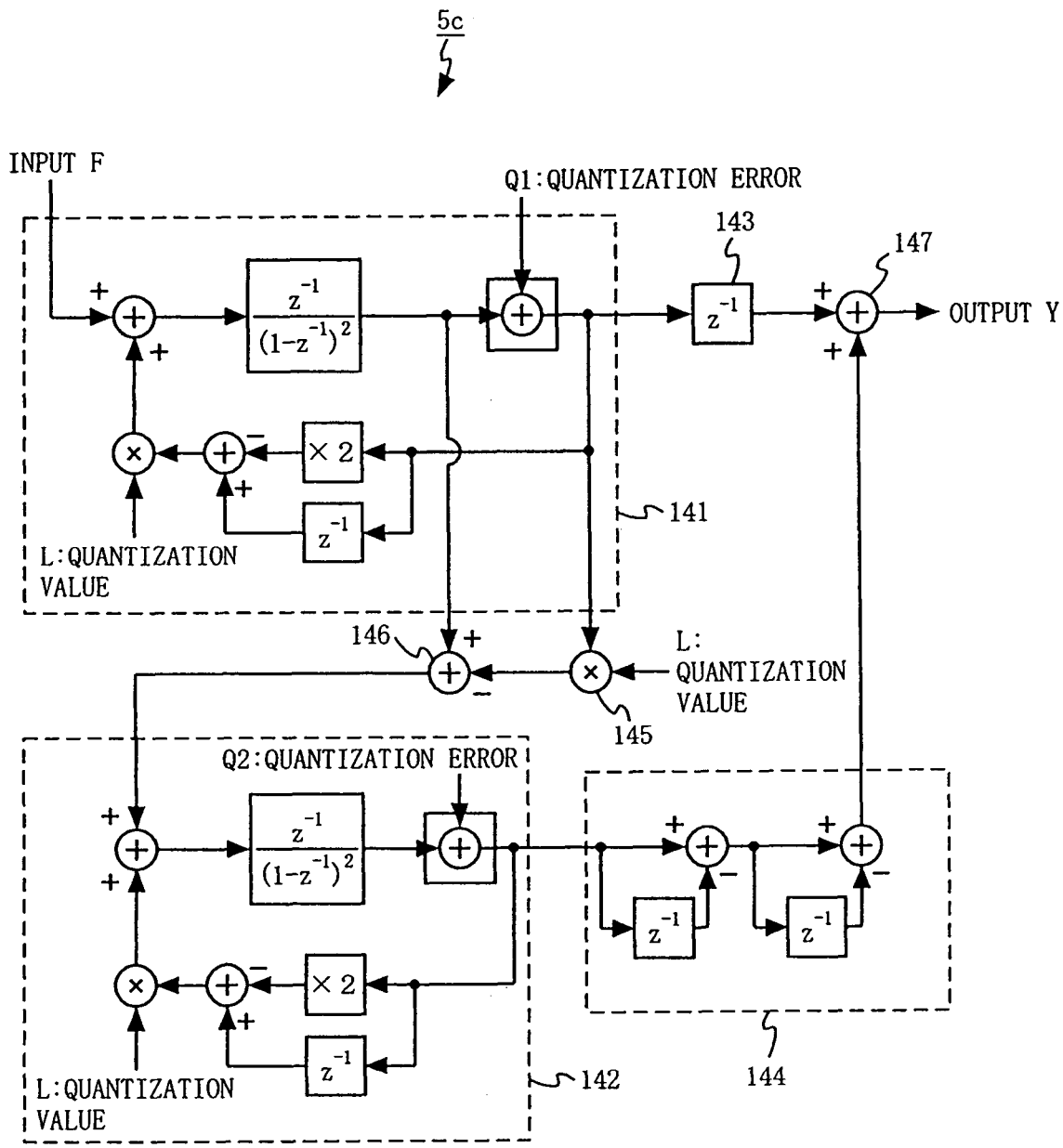
FIG. 4 is an exemplary illustration of another structure of the sigma-delta modulator in the frequency modulator according to the first and second embodiments.

FIG. 4 is an exemplary illustration of the structure of a fourth-order sigma-delta modulator. The sigma-delta modulator 5c shown in FIG. 4 uses two second-order sigma-delta modulators differently structured from the sigma-delta modulator 5a shown in FIG. 2. The sigma-delta modulator 5c includes a first second-order sigma-delta modulator 141, a second second-order sigma-delta modulator 142, a delay circuit 143, a second-order differentiator 144, a multiplier 145, and adders 146 and 147.

An input F of the sigma-delta modulator 5c is inputted into the first second-order sigma-delta modulator 141. A value corresponding to a fractional part of the first second-order sigma-delta modulator 141 is inputted into the second second-order sigma-delta modulator 142 after passing through the multiplier 145 and the adder 146. A value corresponding to an integral part of the first second-order sigma-delta modulator 141 is delayed by 1 clock period by the delay circuit 143, and inputted into the adder 147. The output of the second second-order sigma-delta modulator 142 is inputted into the adder 147 after passing through the second-order differentiator 144. The adder 147 adds these two signals, thereby calculating an output Y of the sigma-delta modulator 5c.

In the sigma-delta modulator 5c, a relationship between the input F and the output Y is represented as $y=-Z^{-2} \times F/L+(1-Z^{-1})^4 \times Q$. Therefore, according to the same consideration as in the case of the sigma-delta modulators 5a and 5b, frequency characteristic $|2 \sin(\pi f/f_s)|^4$ ($f_s$: clock frequency) is multiplexed with the quantization noise Q in the sigma-delta modulator 5c.

Figure 5:
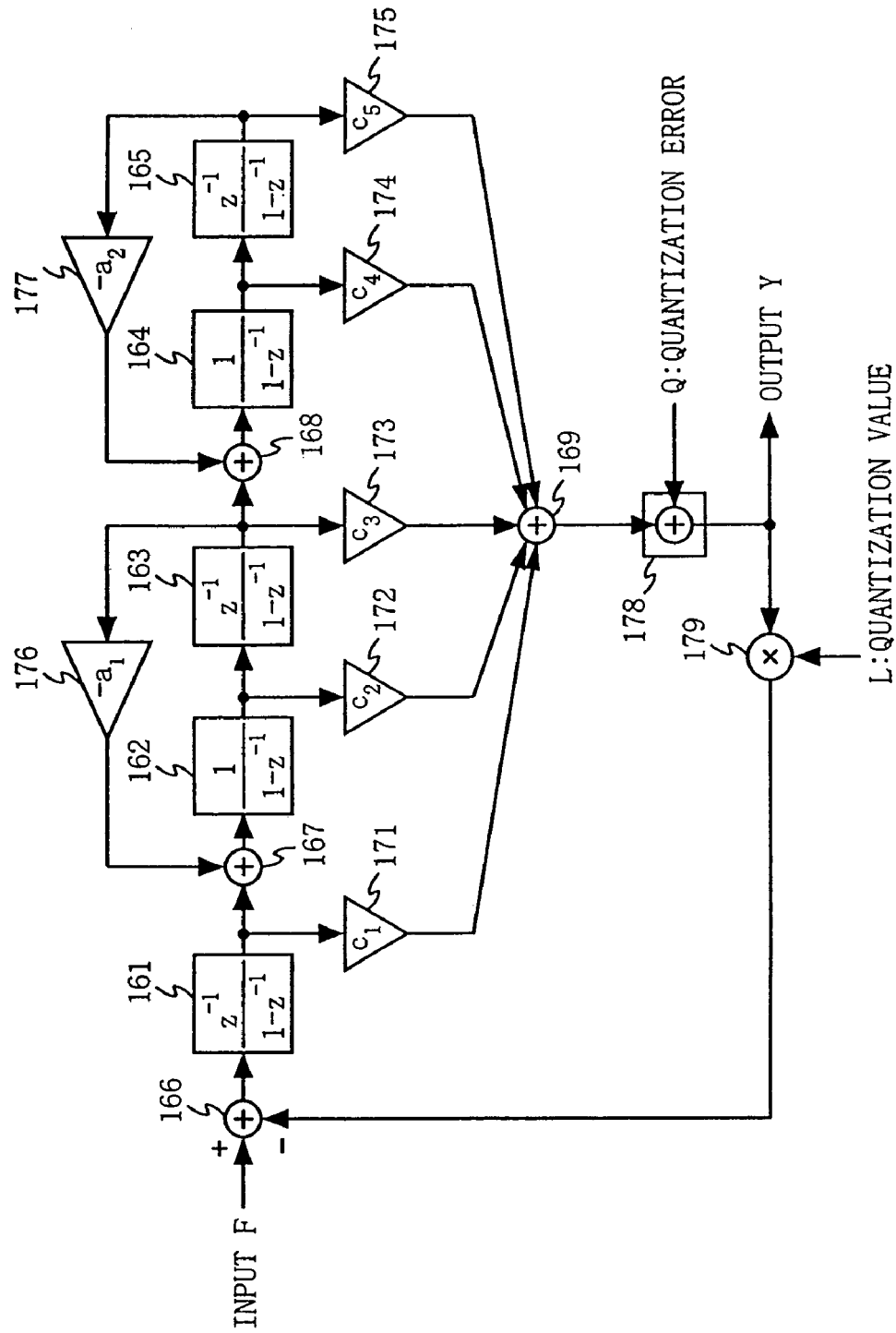
FIG. 5 is an exemplary illustration of another structure of the sigma-delta modulator in the frequency modulator according to the first and second embodiments.

FIG. 5 is an exemplary illustration of the structure of a fifth-order sigma-delta modulator. The sigma-delta modulator 5d shown in FIG. 5 includes first-order integrators 161 to 165, adders 166 to 169, coefficient multipliers 171 to 177, a quantizer 178, and a multiplier 179.

The quantizer 178 quantizes an output of the adder 169 by the quantization value L. The multiplier 179 multiplies the output of the quantizer 178 by the quantization value L. The output of the multiplier 179 is inputted into the adder 166. The adder 166 subtracts the output of the multiplier 179 from an input F of the sigma-delta modulator 5d. The first-order integrator 161 integrates the output of the adder 166. The adder 167 adds the output of the first-order integrator 161 and the output of the coefficient multiplier 176. The first-order integrator 162 integrates the output of the adder 167, and the first-order integrator 163 integrates the output of the first-order integrator 162. The coefficient multiplier 176 multiplies the output of the first-order integrator 163 by a predetermined coefficient (in FIG. 5, $-a_1$). The adder 168 adds the output of the first-order integrator 163 with the output of the coefficient multiplier 177. The first-order integrator 164 integrates the output of the adder 168, and the first-order integrator 165 integrates the output of the first-order integrator 164. The coefficient multiplier 177 multiplies the output of the first-order integrator 165 by a predetermined coefficient (in FIG. 5, $-a_2$).

The coefficient multipliers 171 to 175 each multiply the outputs of the first-order integrators 161 to 165 by predetermined coefficients (in FIG. 5, $c_1$ to $c_5$). The adder 169 sums the outputs of the coefficient multipliers 171 to 175. The output of the quantizer 178 becomes an output Y of the sigma-delta modulator 5d. The sigma-delta modulator 5d allows frequency characteristics of a fifth-order sigma-delta modulation to be changed arbitrarily by arbitrarily setting a coefficient of each coefficient multiplier.

Four exemplary structures of the sigma-delta modulator 5 have been shown as described above, but these circuits are illustrative only. In other words, an arbitrary sigma-delta modulator may be used as the sigma-delta modulator 5 with consideration given to the size of a circuit, frequency characteristics, and delay characteristics, etc. For example, as the sigma-delta modulator 5, second to fifth-order sigma-delta modulators differently structured from those described above may be used, or a higher order sigma-delta modulator may be used.

Figure 6:
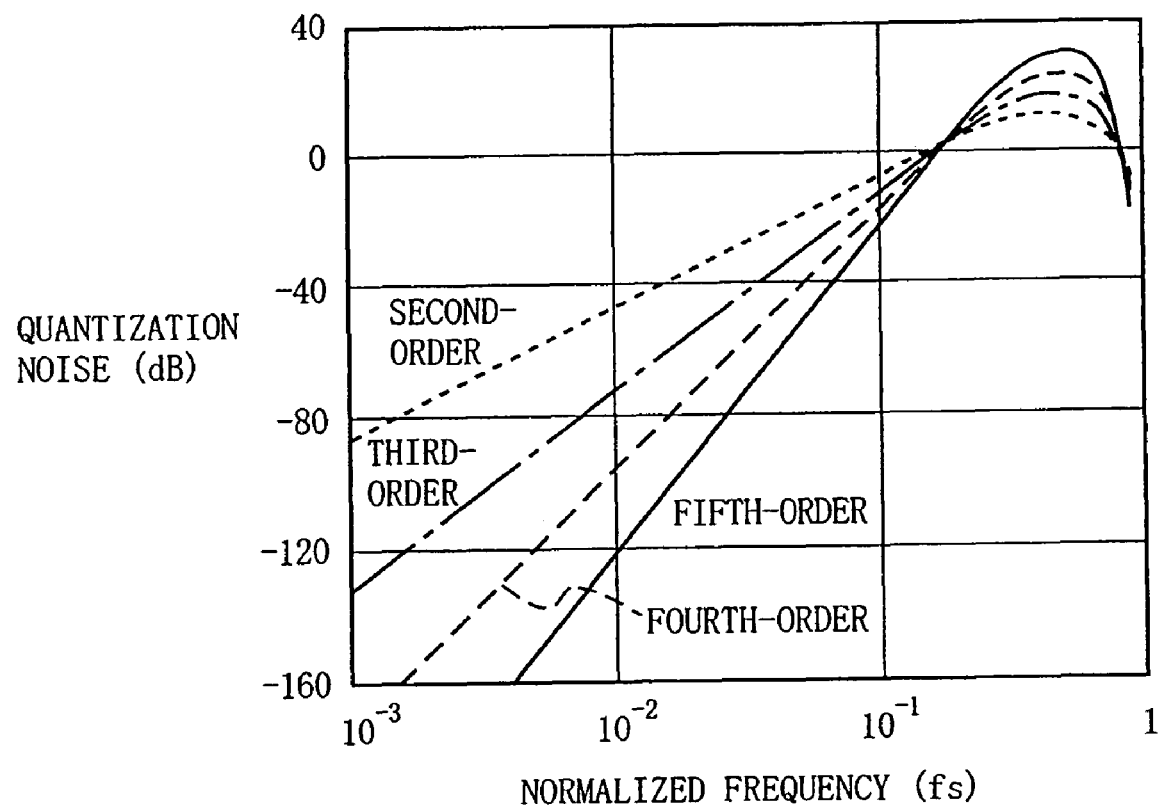
FIG. 6 is an illustration showing an example of quantization noise characteristics in the sigma-delta modulator.

In order to design the sigma-delta modulator 5, it is necessary to first determine the order of the modulator. FIG. 6 is an illustration showing an example of quantization noise characteristics in second to fifth-order sigma-delta modulators. In FIG. 6, the horizontal axis represents a normalized frequency in a log scale, and the vertical axis represents quantization noise in decibels (dB). As shown in FIG. 6, the noise level around direct current (DC) is reduced as the order of the sigma-delta modulator becomes higher. With consideration given to such a point as described above, the sigma-delta modulator 5 may be designed.

Figure 7:
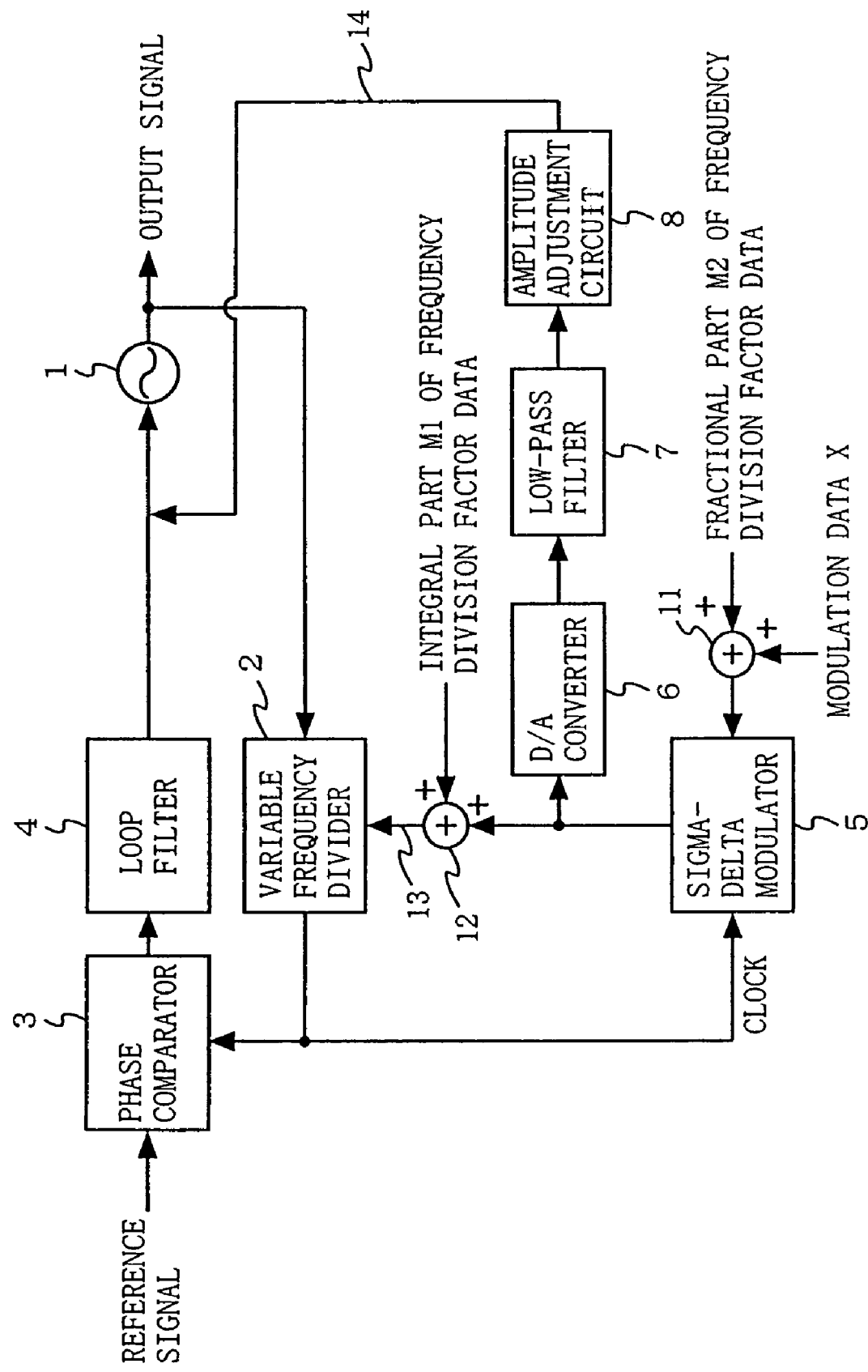
FIG. 7 is a block diagram illustrating the structure of a frequency modulator according to a variant of the first embodiment of the present invention.

Various structures described as follows can be taken as variants of the frequency modulator according to the present embodiment. First, in the frequency modulator shown in FIG. 1, the control signal 14 is assumed to be inputted into the frequency modulation terminal of the voltage controlled oscillator 1. However, in the case where a voltage controlled oscillator 1 having no frequency modulation terminal is used, the control signal 14 may be connected to a junction point between the loop filter 4 and the voltage controlled oscillator 1 as shown in FIG. 7. The frequency modulator shown in FIG. 7 operates in the same manner and produces the same effect as is the case with the frequency modulator shown in FIG. 1.

Figure 8:
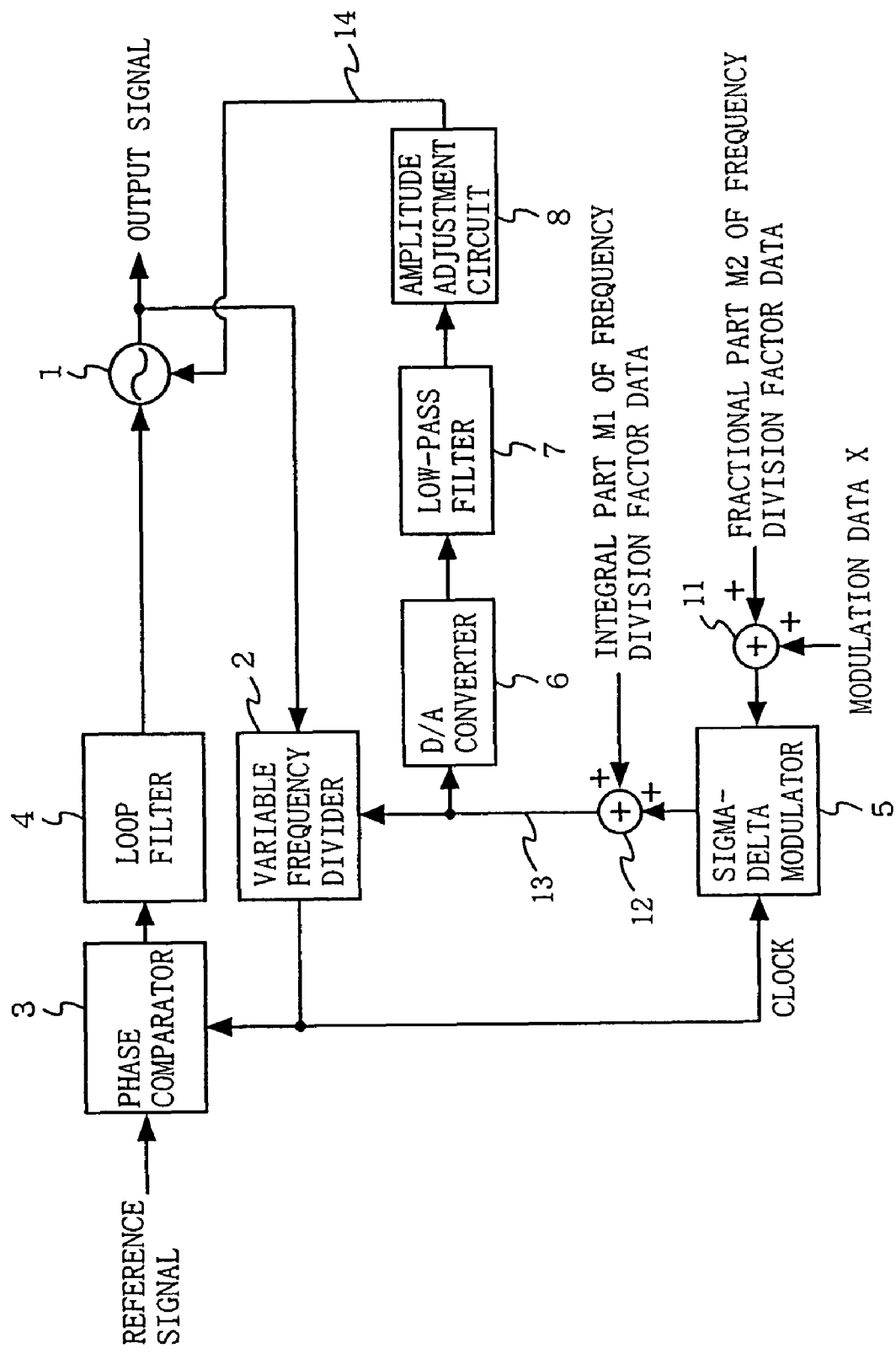
FIG. 8 is a block diagram illustrating the structure of a frequency modulator according to another variant of the first embodiment of the present invention.

Furthermore, in the frequency modulator shown in FIG. 1, the output of the sigma-delta modulator 5 is assumed to become the control signal 14 after passing through the D/A converter 6, the low-pass filter 7, and the amplitude adjustment circuit 8. Otherwise, as shown in FIG. 8, the output of the adder 12 (that is, data obtained by adding the output of the sigma-delta modulator 5 and with an integral part M1 of the frequency division factor data) may become the control signal 14 after passing through the D/A converter 6, the low-pass filter 7, and the amplitude adjustment circuit 8. If the amplitude adjustment circuit 8, which can process an input signal to which the integral part M1 has been added, is used, the frequency modulator shown in FIG. 8 operates in the same manner and produces the same effect as is the case with the frequency modulator shown in FIG. 1.

Still further, the sigma-delta modulator 5 may use, as a clock, a reference signal provided from an external source. Also, it is possible to increase the modulation accuracy by using a voltage controlled oscillator 1 whose change of output frequency in response to a change in input frequency at the frequency modulation terminal is smaller compared to its change of output frequency in response to a change in input frequency at the frequency control terminal.

As long as the D/A converter 6, the low-pass filter 7, and the amplitude adjustment circuit 8 are placed on the route from the sigma-delta modulator 5 to the voltage controlled oscillator 1, a connecting order thereof may be arbitrary. Also, if the frequency modulation sensitivity of the voltage controlled oscillator 1 is constant, the amplitude adjustment circuit 8 may be a fixed attenuator. Furthermore, the voltage controlled oscillator 1 may be provided with the frequency modulation terminal that also functions as a terminal connected to the loop filter 4, or may be provided with the frequency modulation terminal separately from the terminal connected to the loop filter 4. Still further, a part of the components shown in FIG. 1 (for example, the sigma-delta modulator 5) may be realized by a program.

Second Embodiment

Figure 9:
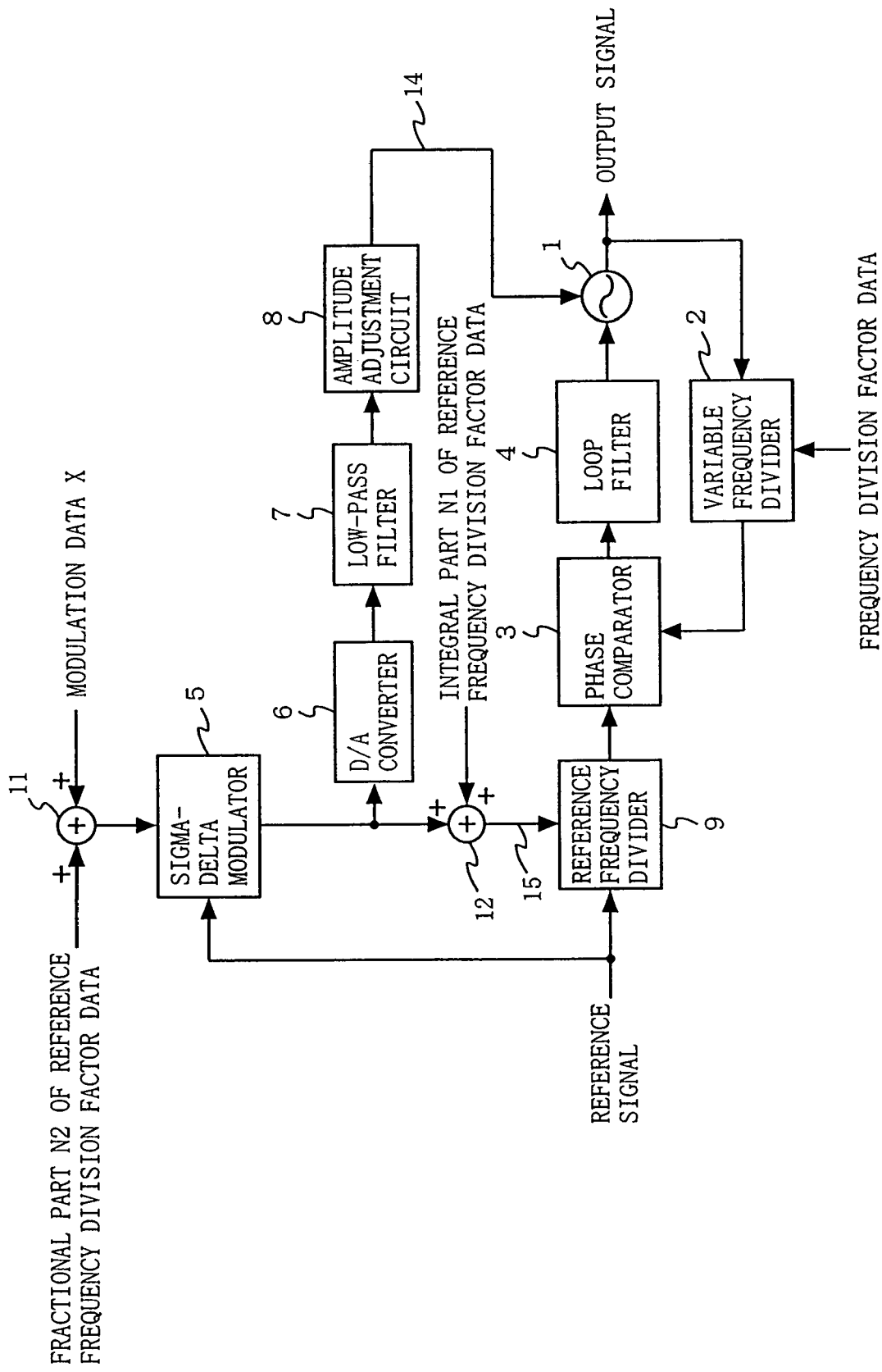
FIG. 9 is a block diagram illustrating the structure of the frequency modulator according to the second embodiment of the present invention.

FIG. 9 is a block diagram illustrating the structure of the frequency modulator according to a second embodiment of the present invention. The frequency modulator shown in FIG. 9 includes the voltage controlled oscillator 1, the variable frequency divider 2, the phase comparator 3, the loop filter 4, the sigma-delta modulator 5, the D/A converter 6, the low-pass filter 7, the amplitude adjustment circuit 8, a reference frequency divider 9, and the adders 11 and 12. Any components that function in similar manners to their counterparts in the first embodiment are denoted by like numerals, with the descriptions thereof omitted.

As is the case with the first embodiment, a reference signal with a predetermined frequency is provided to the frequency modulator shown in FIG. 9 from an external signal source (not shown), which can be a signal source having no frequency modulation function. The voltage controlled oscillator 1, the variable frequency divider 2, the phase comparator 3, and the loop filter 4 form a phase locked loop (PLL), as is the case with the first embodiment. However, the PLL shown in FIG. 9 differs from that shown in FIG. 1 in the following four points. First, the reference signal provided from the external source is frequency-divided by the reference frequency divider 9, and inputted into the PLL. Second, the variable frequency divider 2 divides a frequency of an output signal of the voltage controlled oscillator 1 in accordance with frequency division factor data independent of the modulation data X. Third, the phase comparator 3 compares the phases of an output signal of the variable frequency divider 2 and an output signal of the reference frequency divider 9. Fourth, the variable frequency divider 2 may be a frequency divider whose frequency division factor is fixed.

The reference frequency divider 9 divides a frequency of the externally provided reference signal in accordance with provided effective reference frequency division factor data 15. The effective reference frequency division factor data 15 provided to the reference frequency divider 9 is calculated by substantially the same method as that used for calculating the effective frequency division factor data 13 according to the first embodiment. That is, reference frequency division factor data is externally provided to the reference frequency divider 9 as a set of an integral part N1 of the reference frequency division factor data and a fractional part N2 of the reference frequency division factor data. The adder 11 adds the fractional part N2 with digital modulation data X. The sigma-delta modulator 5 sigma-delta modulates the output data of the adder 11 by using the reference signal as a clock. The adder 12 adds the output signal of the sigma-delta modulator 5 with the integral part N1. The sum obtained by the adder 12 becomes the effective reference frequency division factor data 15.

On the other hand, the output signal of the sigma-delta modulator 5 becomes the control data 14 after passing through the D/A converter 6, the low-pass filter 7, and the amplitude adjustment circuit 8, as is the case with the first embodiment. The control signal 14 is inputted into the frequency modulation terminal of the voltage controlled oscillator 1.

The frequency modulator structured as above performs two types of frequency modulation at the same time, as is the case with the first embodiment. In a first frequency modulation, the modulation data X is sigma-delta modulated, and provided to the reference frequency divider 9 as the effective reference frequency division factor data 15. As a result, the output signal of the PLL is frequency-modulated. The first frequency modulation produces an effect similar to the low-pass characteristics shown in FIG. 14 in solid line. A second frequency modulation is the same as that described in the first embodiment. The second frequency modulation produces an effect similar to the high-pass characteristics shown in FIG. 14 in dashed line.

Therefore, the degree of modulation of the output signal of the frequency modulator corresponds to the sum of the low-pass characteristics (solid line) and the high-pass characteristics (dashed line) shown in FIG. 14. Thus, the frequency modulator according to the present embodiment enables the use of a reference signal source having no frequency modulation function, and also allows flat frequency modulation characteristics to be obtained for a modulation signal having a bandwidth wider than a loop bandwidth based on digital modulation data. Especially, as shown in FIG. 14, even if the frequency bandwidth of the modulation data is wider than the bandwidth of the loop filter, and the highest frequency of the modulation data is smaller than the frequency of the reference signal, the same effect can be produced.

Figure 10:
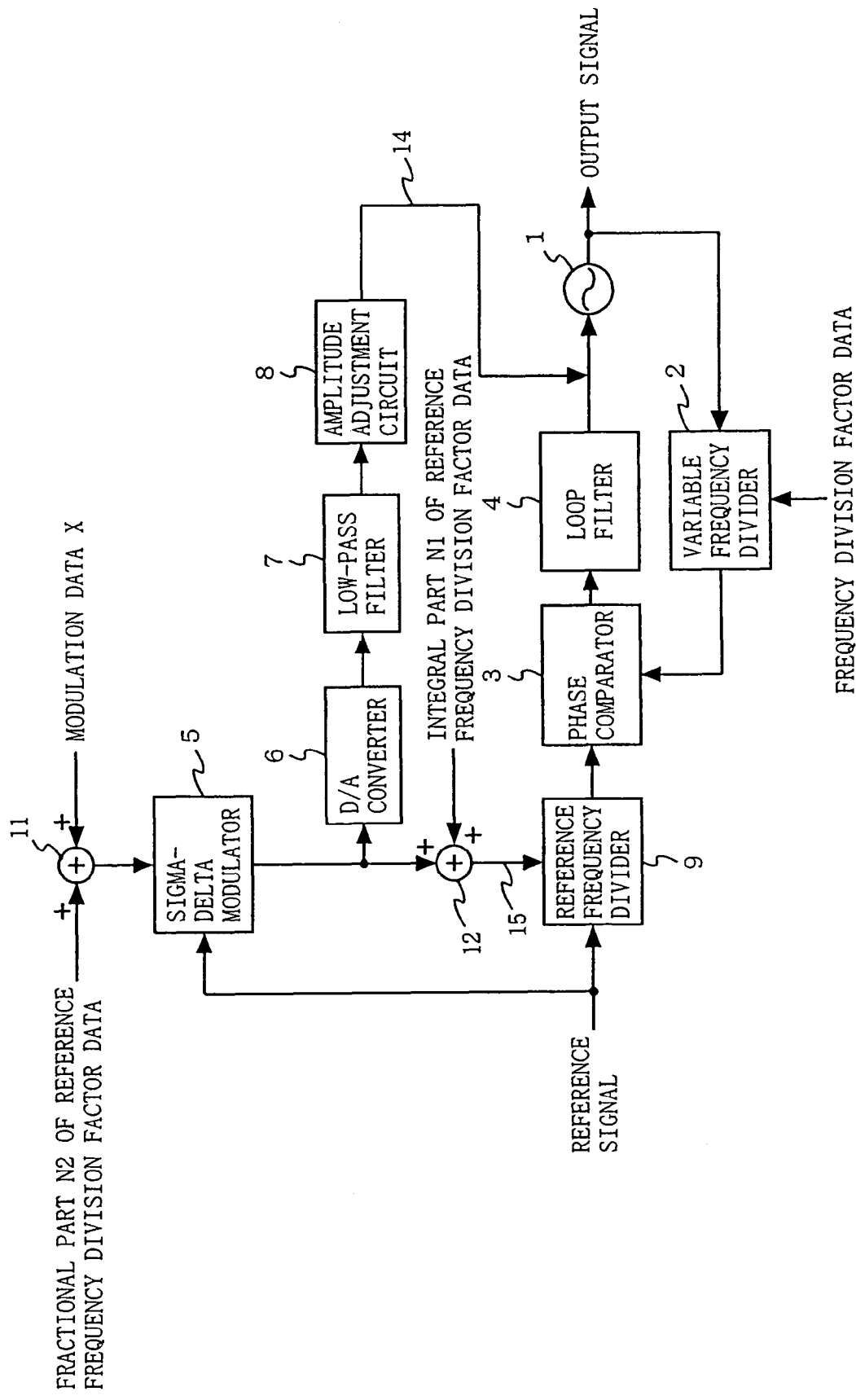
FIG. 10 is a block diagram illustrating the structure of a frequency modulator according to a variant of the second embodiment of the present invention.
Figure 11:
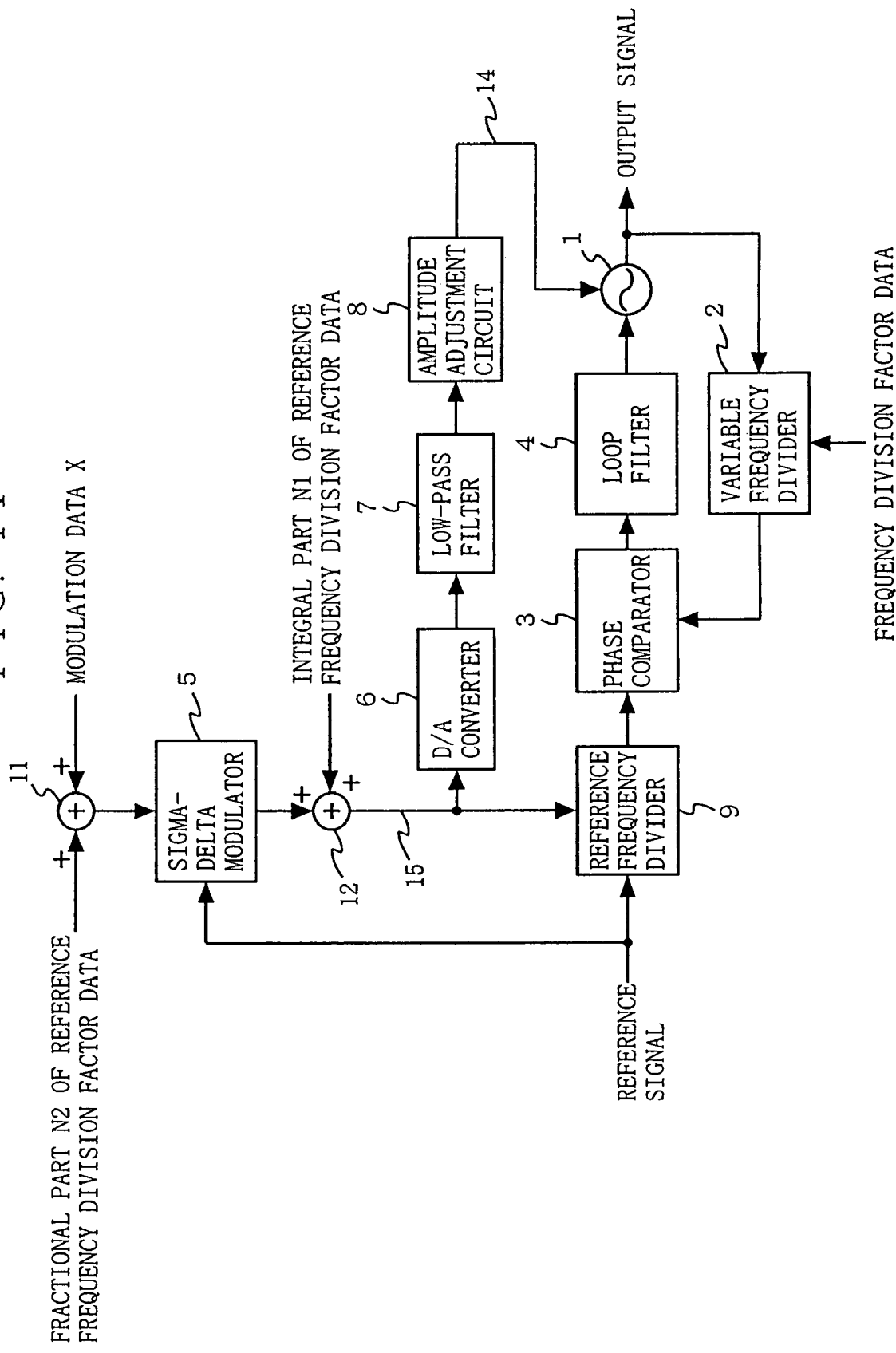
FIG. 11 is a block diagram illustrating the structure of a frequency modulator according to another variant of the second embodiment of the present invention.

Note that the structure of the frequency modulator according to the present embodiment can take the same variants (except for clock selectability of the sigma-delta modulator 5) described in the first embodiment. For example, as the sigma-delta modulator 5, the sigma-delta modulators 5a to 5d shown in FIGS. 2 to 5, respectively, second to fifth-order sigma-delta modulators structured differently from those shown in FIGS. 2 to 5, or a higher order sigma-delta modulator may be used. Furthermore, as shown in FIG. 10, the control signal 14 may be connected to a junction point between the loop filter 4 and the voltage controlled oscillator 1. Still further, as shown in FIG. 11, an output of the adder 12 (that is, data obtained by adding an output of the sigma-delta modulator 5 with the integral part M1 of the frequency division factor data) may become the control signal 14 after passing through the D/A converter 6, the low-pass filter 7, and the amplitude adjustment circuit 8.

Third Embodiment

Figure 12:
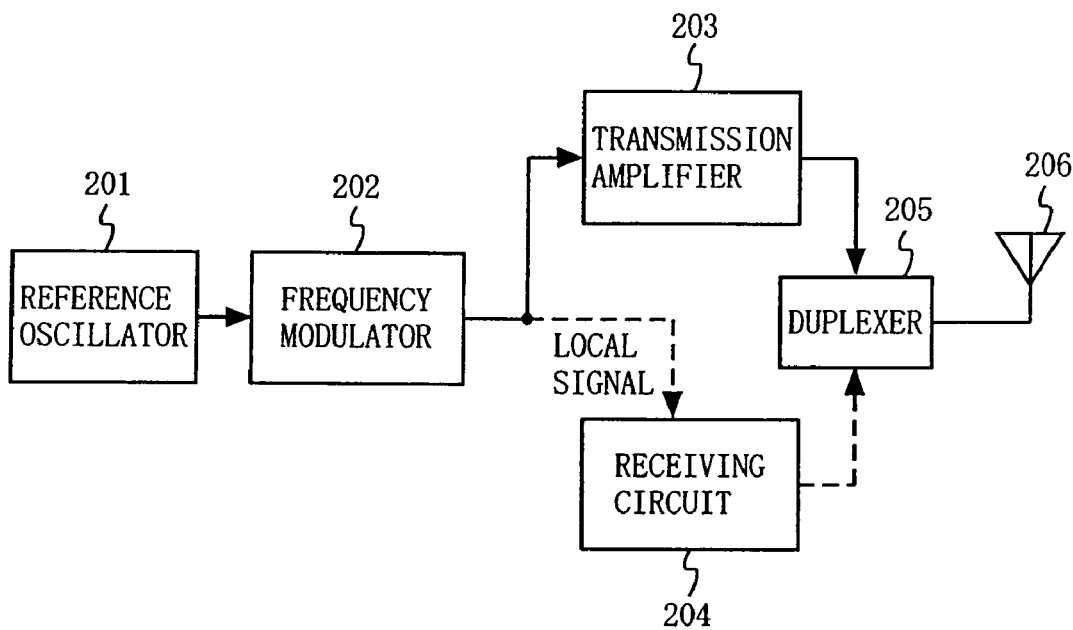
FIG. 12 is a block diagram illustrating the structure of a wireless circuit according to a third embodiment of the present invention.
Figure 13:
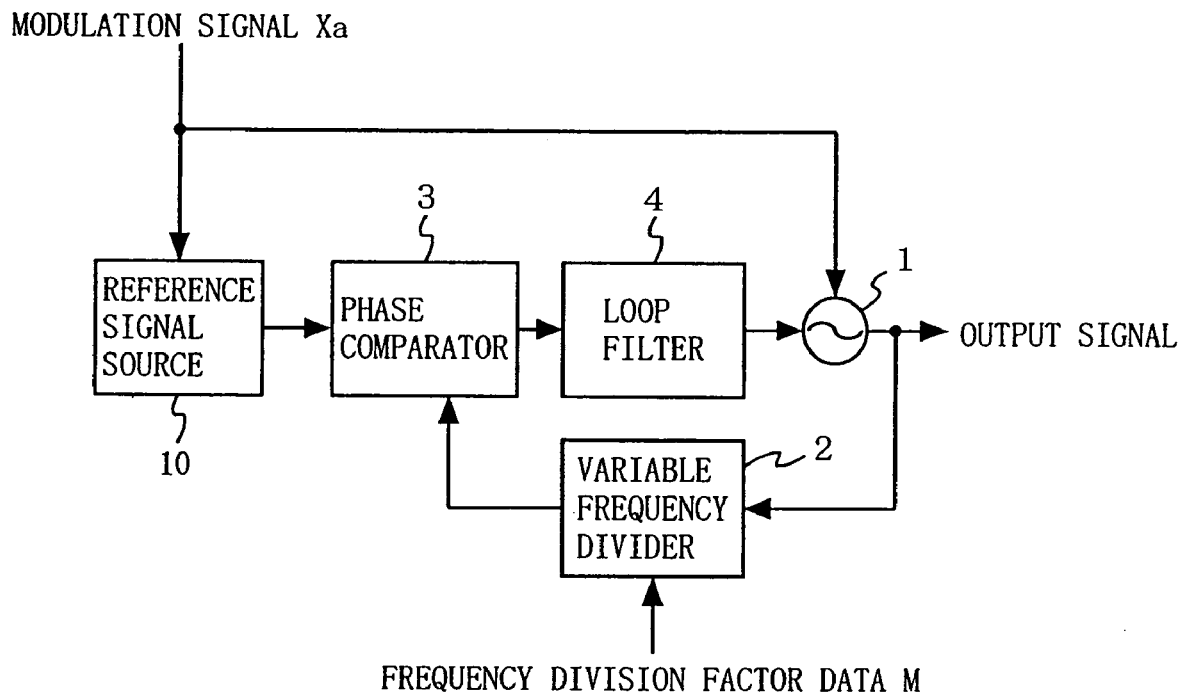
FIG. 13 is a block diagram illustrating the structure of a conventional frequency modulator.

FIG. 12 is a block diagram illustrating the structure of a wireless circuit according to a third embodiment of the present invention. The wireless circuit according to the present embodiment uses the frequency modulator according to the first or second embodiment. The wireless circuit shown in FIG. 12 includes a reference oscillator 201, a frequency modulator 202, a transmission amplifier 203, a receiving circuit 204, a duplexer 205, and an antenna 206. This wireless circuit transmits and receives data to and from a wireless circuit at the other end (not shown).

The reference oscillator 201 generates a reference signal with a predetermined frequency. The reference oscillator 201 is structured by, for example, a crystal oscillator whose operation is stable. The reference signal generated by the reference oscillator 201 is provided to the frequency modulator 202. The frequency modulator 202 is a frequency modulator according to the first or second embodiment, and operates based on the reference signal generated by the reference oscillator 201.

The output signal of the frequency modulator 202 is used differently in data transmission and data reception. When data is transmitted (in FIG. 12, shown as a solid line), the data to be transmitted is inputted into the frequency modulator 202 as modulation data, and the output signal of the frequency modulator 202 is inputted into the transmission amplifier 203 as a frequency-modulated wave. The transmission amplifier 203 amplifies the inputted frequency-modulated wave. The signal amplified by the transmission amplifier 203 is transmitted from the antenna 206 as an electric wave after passing through the duplexer 205.

When data is received (in FIG. 12, shown as a dashed line), no modulation data is inputted into the frequency modulator 202. Otherwise, the frequency modulator 202 is controlled so as to output a non-modulated signal. The non-modulated signal outputted from the frequency modulator 202 is inputted into the receiving circuit 204 as a local signal for demodulating a wireless signal, and also inputted into the duplexer 205. The receiving circuit 204 uses the non-modulated signal as the local signal, and demodulates the output signal of the duplexer 205.

As described above, even if no analog modulation signal is provided, the wireless circuit according to the present embodiment can realize a wireless circuit by providing digital data for designating a frequency channel and digital modulation data for performing frequency modulation.

While the invention has been described in detail, the foregoing description is in all aspects illustrative and not restrictive. It is understood that numerous other modifications and variations can be devised without departing from the scope of the invention.

What is claimed is:

1. A frequency modulator that performs frequency modulation based on digital modulation data, comprising:
    a sigma-delta modulator for sigma-delta modulating data obtained by adding a fractional part of provided frequency division factor data with modulation data;
    a voltage controlled oscillator that can control an oscillation frequency;
    a variable frequency divider for dividing a frequency of an output of the voltage controlled oscillator based on data obtained by adding an output of the sigma-delta modulator with an integral part of the frequency division factor data;
    a phase comparator for comparing phases of a provided reference signal and an output of the variable frequency divider; and
    a loop filter for smoothing an output of the phase comparator and providing the smoothed signal to the voltage controlled oscillator, wherein
    the output of the voltage controlled oscillator is frequency-modulated based on a control signal that is an analog signal converted from data obtained by adding the output of the sigma-delta modulator with the integral part of the frequency division factor data.

2. The frequency modulator according to claim 1, wherein the frequency divider is a variable frequency divider.

3. The frequency modulator according to claim 1, wherein the voltage controlled oscillator includes:
    a frequency control terminal connected to the loop filter; and
    a frequency modulation terminal for inputting the control signal, and
    the voltage controlled oscillator controls the oscillation frequency based on an output of the loop filter and the control signal inputted from the frequency modulation terminal.

4. The frequency modulator according to claim 3, wherein the voltage controlled oscillator whose change of output frequency in response to a change in input frequency at the frequency modulation terminal is smaller compared to its change of output frequency in response to a change in input frequency at the frequency control terminal.

5. The frequency modulator according to claim 1, wherein the control signal is connected to a junction point between the loop filter and the voltage controlled oscillator.

6. The frequency modulator according to claim 1, wherein a frequency bandwidth of the modulation data is wider than a bandwidth of the loop filter, and a highest frequency of the modulation data is smaller than a frequency of the reference signal.

7. The frequency modulator according to claim 1, further comprising, on a route from the sigma-delta modulator to the voltage controlled oscillator, an amplitude adjustment circuit for adjusting signal amplitude.

8. The frequency modulator according to claim 1, further comprising, on a route from the sigma-delta modulator to the voltage controlled oscillator, a low-pass filter for removing a noise component caused in the sigma-delta modulator.

9. The frequency modulator according to claim 1, wherein the sigma-delta modulator operates by using the reference signal as a clock, and is of at least a second order or higher.

10. A frequency modulating method for performing frequency modulation based on digital modulation data by using a phase locked loop having a voltage controlled oscillator, a variable frequency divider, a phase comparator, and a loop filter, the method comprising:
    sigma-delta modulating data obtained by adding a fractional part of provided frequency division factor data with modulation data;
    providing data obtained by adding the sigma-delta modulated signal with an integral part of the frequency division factor data to the variable frequency divider; and
    frequency modulating an output of the voltage controlled oscillator based on a control signal that is an analog signal converted from the data obtained by adding the sigma-delta modulated signal with the integral part of the frequency division factor data.

* * * * *